United States Patent
Bernard et al.

(10) Patent No.: US 7,219,692 B2
(45) Date of Patent: May 22, 2007

(54) APPARATUS FOR CONDITIONING THE ATMOSPHERE IN A CHAMBER

(75) Inventors: Roland Bernard, Viuz-la-Chiesaz (FR); Eric Chevalier, Annecy le Vieux (FR); Gloria Sogan, Epagny (FR)

(73) Assignee: Alcatel, Paris (FR)

( * ) Notice: Subject to any disclaimer, the term of this patent is extended or adjusted under 35 U.S.C. 154(b) by 327 days.

(21) Appl. No.: 09/981,743

(22) Filed: Oct. 19, 2001

(65) Prior Publication Data

US 2002/0022283 A1 Feb. 21, 2002

Related U.S. Application Data

(63) Continuation of application No. 09/614,591, filed on Jul. 12, 2000, now Pat. No. 6,316,045.

(30) Foreign Application Priority Data

Apr. 20, 2000 (FR) .................................. 00 05094

(51) Int. Cl.
*F16F 7/00* (2006.01)
*F04F 3/00* (2006.01)
*F04B 23/08* (2006.01)

(52) U.S. Cl. .............................. 137/565.23; 137/565.3; 417/205; 417/363

(58) Field of Classification Search ........... 137/565.23, 137/565.3; 417/2, 205, 363, 228; 118/663, 118/696, 708, 715; 427/8, 248.1
See application file for complete search history.

(56) References Cited

U.S. PATENT DOCUMENTS

| | | | | | |
|---|---|---|---|---|---|
| 4,360,087 A | * | 11/1982 | Curwen | ....................... | 417/363 |
| 5,039,280 A | * | 8/1991 | Saulgeot et al. | ............ | 417/205 |
| 5,769,626 A | * | 6/1998 | Hauff et al. | ................. | 417/205 |
| 5,951,834 A | | 9/1999 | Satoh | ......................... | 118/663 |
| 6,316,045 B1 | * | 11/2001 | Bernard et al. | ................ | 427/8 |

FOREIGN PATENT DOCUMENTS

EP 1 014 427 A2 * 6/2000

* cited by examiner

*Primary Examiner*—John Rivell
(74) *Attorney, Agent, or Firm*—Sughrue Mion, PLLC

(57) ABSTRACT

In the invention, the atmosphere in a process chamber is conditioned using a primary pump, a secondary pump, speed control means for controlling the speed of the primary pump, and at least first gas analyzer means adapted for analyzing the extracted gases upstream from the primary pump and for producing first analysis signals. First signal processing means control the pumping speed as a function of the first analysis signals, so as to determine the variation in the pressure inside the process chamber during the transient stages of the treatment. In this way, deposits and turbulence are avoided in the process chamber, as are deposits in the pumping line, so that the secondary pump can be placed in the immediate vicinity of the process chamber.

11 Claims, 2 Drawing Sheets

APPARATUS FOR CONDITIONING THE ATMOSPHERE IN A CHAMBER

This is a continuation of application Ser. No. 09/614,591 filed Jul. 12, 2000 now U.S. Pat. No. 6,316,045, the disclosure of which is incorporated herein by reference.

The present invention relates to methods and apparatus for pumping gases out from a process chamber such as a process chamber used in manufacturing semiconductor electronic components.

BACKGROUND OF THE INVENTION

In manufacturing semiconductor electronic components, an important step consists in treating a semiconductor substrate in a controlled atmosphere at very low pressure, e.g. for depositing layers of various materials by plasma deposition.

In industrial production, substrates in the form of wafers are conditioned and brought successively into a process chamber through an airlock or through a transfer chamber. In the process chamber, the atmosphere must be controlled very accurately, in particular to avoid the presence of any impurity or of any pollution.

Progress made in recent years in the semiconductor industry is essentially related to the increase in the integration of electronic circuits into components of a few square millimeters in area, defined on silicon wafers that are increasingly large.

Numerous (up to 400) technological steps are required to make such circuits, and, during the process, the pressure in the process chamber is subjected to sudden variations between various steps during which the pressure must be controlled and set to appropriate values.

Generating the low-pressure controlled-atmosphere in the process chamber requires the use of effective pumping systems. Such a system generally comprises a primary pump whose outlet is connected to atmosphere and whose inlet is connected to the outlet of a secondary pump such as a turbomolecular pump whose inlet is connected to the process chamber.

The process steps in the process chamber require the presence of special gases, and, by acting on the substrate, they generate gaseous compounds that must be removed. As a result, the pumping system must pump a variable atmosphere containing gaseous compounds that must be treated by gas treatment apparatus in order to deliver to atmosphere only compounds that are inoffensive.

Currently, pumping and gas treatment systems are situated remote from process chambers, i.e. they are connected to process chambers via long and costly pipes that are over ten meters long.

The reason behind that distance and those pipes is that current pumping and gas treatment systems are heavy and voluminous, and they give rise to adverse effects such as vibrations that it is essential to avoid in the process chamber.

Currently, an electronic component factory is therefore designed in a building having at least two levels, the upper level containing the process chamber(s), and the lower level containing the pumping and gas treatment apparatus. Pipes interconnect the two levels to convey the vacuum.

The pipes which are essential in known structures suffer from several drawbacks:

the pipes themselves generate vibrations;

the pipes constitute a large surface area on which the pumped gases can deposit in the form of particles; particles deposited in that way can backscatter from the pipe into the process chamber, thereby increasing the contamination of the chamber during subsequent steps of the process;

the pipes require major mechanical support means;

to reduce the deposits in the pipes, it is possible to provide temperature control, but such control is extremely costly and very difficult to implement;

a monitoring and control system that is complex to implement must be provided for reasons of safety in the event of leakage, since the pumped gases are harmful; and the considerable amount of space needed requires large facilities and large floor areas for the factories; their cost is very high; losses from the cold line are non-negligible.

OBJECTS AND SUMMARY OF THE INVENTION

An object of the invention is to integrate in the immediate vicinity of the process chamber the various elements making up the vacuum line, thereby eliminating the problems due to the piping. An object is thus to design a system that can be connected directly to the process chamber, thereby making it possible to direct the effluent as quickly as possible to the gas treatment apparatus, thereby improving the effectiveness thereof.

But the problem is then that the immediate proximity of the active members of the vacuum line constitutes an increased risk of polluting the process chamber, it being possible for the pollution to be, in particular, chemical, thermal, or mechanical. For example, the proximity of the process chamber gives rise to deposits of particles on the active members of the vacuum line, such as the pumps or the valves, thereby increasing the risk of pollution by backscattering towards the process chamber.

For this reason, the invention aims both to reduce the cost of the installations by avoiding the presence of pipes between the process chamber and the pumping and gas treatment apparatus, and also to reduce the risks of polluting the process chamber.

Another object of the invention is to facilitate adapting the pumping system to various process chamber structures, by optimizing the effectiveness of the process control in the process chamber.

Another object of the invention is to improve the effectiveness of the gas treatment in order to eradicate or to reduce appropriately any discharge to the atmosphere of toxic matter.

Another object of the invention is to make it possible to dispose the pumping means in the immediate vicinity of the process chamber, in particular by reducing the size of said means.

To achieve these objects and others, the invention provides a method of conditioning the atmosphere in a process chamber for treating a substrate, in which method:

the gases are pumped out from the process chamber by means of a primary pump and of at least one secondary pump;

the pumping speed is adjusted so as to maintain the pressure adapted to each treatment step in the process chamber;

the extracted gases are analyzed upstream from the primary pump; and the result of the analysis of the extracted gases is used to adjust the pumping speed as a function of the pumped gases, so as to determine the variation in the pressure inside the process chamber during the stages of the treatment.

In an advantageous implementation, to adjust the pumping speed as a function of the extracted gases, a pre-recorded transfer function is used which, for each gas mixture present in the process chamber during the treatment, represents the relationship between the pumping speed, the flow rate, and the resulting pressure in the process chamber.

By improving the control over the pumped gases, it is advantageously possible to make provision for said at least one secondary pump to be connected to the process chamber via a pipe of length shorter than three meters.

For example, said at least one secondary pump may be adjacent to the process chamber.

Preferably, in the invention, the gas treatment function is integrated into the pumping line by:

treating the gases downstream from the primary pump; and analyzing the gases at the outlet of the primary pump so as to determine their nature and their state and so as to adapt the pumping parameters, constituted by the temperature of the primary pump, the injection of dilution gas into the primary pump, and the speed of the primary pump, in order to optimize the effectiveness of their treatment.

Preferably, the gases are also analyzed on exiting from the treatment so as to adapt the treatment as a function of the result of said analysis. It is possible to interrupt the pumping in the event that a treatment defect is detected by said analysis of the gases exiting from the treatment.

In order to make it easier to adapt the pumping means to various process chamber structures, it is advantageously possible to make provision to cause the pumping speed to vary during a prior training step in the presence of at least some of the gas mixtures that can be present during the treatment steps in the process chamber, and the resulting pressure in the process chamber is measured to determine said transfer function.

The invention also provides apparatus for conditioning the atmosphere in a process chamber for treating a substrate, using a method as defined above, said apparatus comprising:

a pumping line comprising said primary pump constituted by a variable-speed dry primary pump, and at least one secondary pump mounted upstream from said primary pump;

speed control means for controlling the speed of the primary pump;

first gas analyzer means suitable for analyzing the extracted gases upstream from the primary pump, and for producing first gas analysis signals; and first signal processing means for producing a speed control signal as a function of said first gas analysis signals, and for transmitting said speed control signal to the control means for controlling the primary pump.

In an advantageous embodiment, the first signal processing means perform relationship matching between the first analysis signals at their inlet and the speed control signal at their outlet, using a pre-recorded transfer function that, for each gas mixture present in the process chamber during the treatment of the substrate, represents a relationship between the pumping speed, the flow rate of the gas mixture present, and the resulting pressure in the process chamber.

Preferably, the apparatus of the invention further comprises:

downstream from the primary pump, gas treatment means for treating the extracted gases;

at the outlet of the primary pump, second gas analyzer means determining the nature and the state of the pumped gases and producing second gas analysis signals; and second signal processing means for producing second speed control signals for controlling the speed of the primary pump as a function of the second gas analysis signals, which second control signals can be sent to the power supply apparatus of the primary pump.

In an advantageous embodiment, making it possible for the operation of the process chamber to be further improved, the primary pump, the gas treatment means and the gas analyzer means are enclosed together in an isolation enclosure.

BRIEF DESCRIPTION OF THE DRAWINGS

Other objects, characteristics, and advantages of the present invention appear from the following description of particular embodiments given with reference to the accompanying drawings, in which.

MORE DETAILED DESCRIPTION

Figure 1:
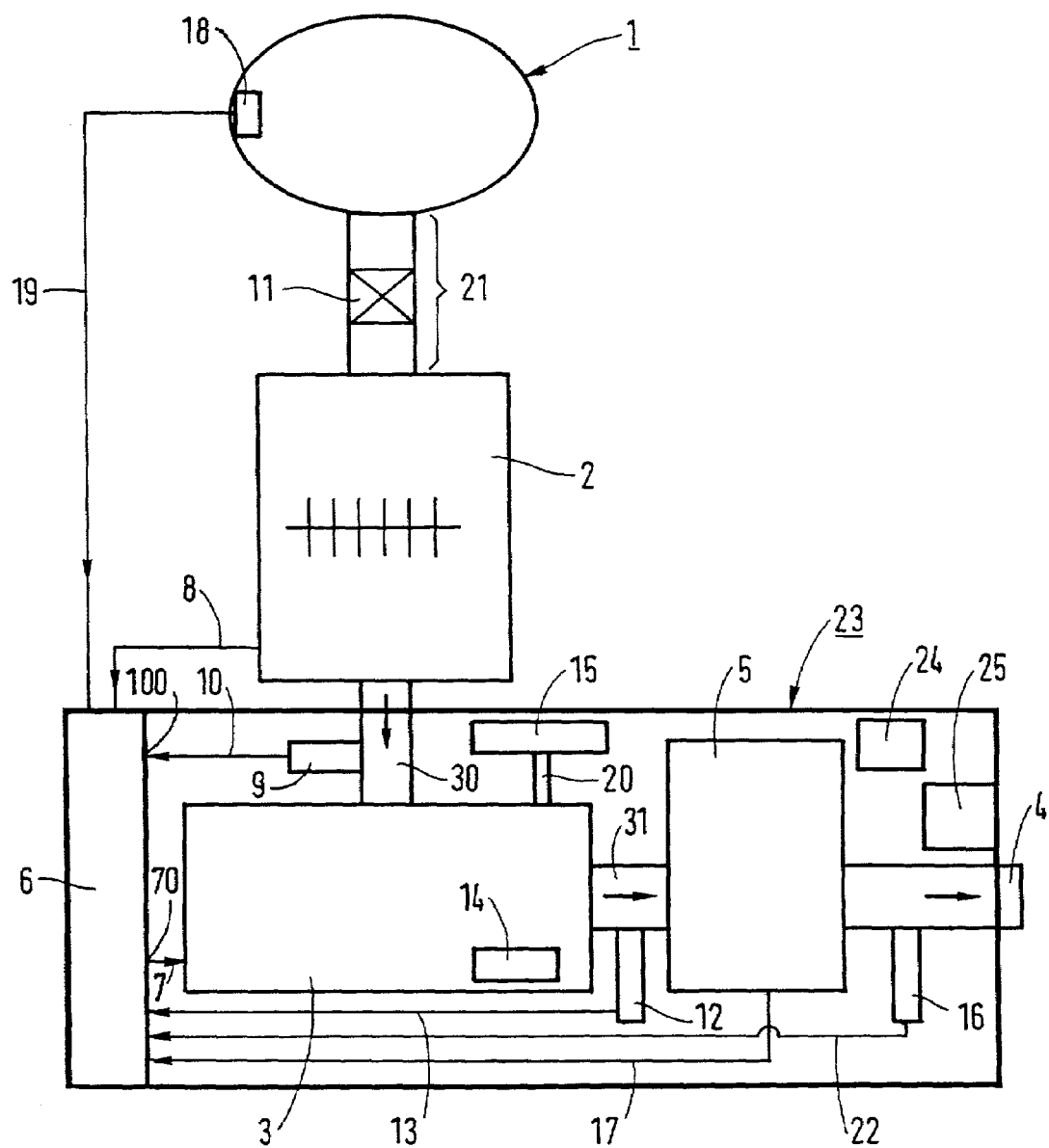
FIG. 1 is a structural diagrammatic view of an embodiment of pumping and gas treatment apparatus of the present invention.

As shown in FIG. 1, the system of the invention makes it possible to control mainly the pressure inside a process chamber 1, by pumping by means of a pumping line essentially comprising a secondary pump 2 having an inlet connected to the process chamber 1 and an outlet connected to the primary pump 3 which itself has an outlet connected to atmosphere via an outlet pipe 4 and via a gas treatment system 5.

The primary pump 3 is a variable-speed dry primary pump suitable for delivering at atmospheric pressure. The secondary pump 2 is, for example, a turbomolecular pump suitable for establishing the appropriate low pressure in the process, or vacuum, chamber 1, and for delivering at the inlet pressure of the primary pump 3 via a pipe 30.

Control means are provided for controlling the speed of the primary pump 3, e.g. a controller 6 connected to the primary pump 3 via a primary pump control line 7. In a manner known per se, the primary pump 3 includes power supply apparatus suitable for achieving the speed which is variable as a function of the signals received over the primary pump control line 7.

Similarly, control means may be provided for controlling the speed of the secondary pump 2, such as, for example, the same controller 6 connected to the secondary pump 2 via a secondary pump control line 8.

First gas analyzer means 9 are suitable for analyzing the gases extracted upstream from the primary pump 3, and for producing first analysis signals which are sent to the controller 6 via a first analysis signal line 10. The controller 6 is programmed such as to constitute first signal processing means for producing a speed control signal as a function of the first analysis signals procured by the first gas analyzer means 9, and for transmitting said speed control signal to the power supply apparatus of the primary pump 3 via the primary pump control line 7.

For this purpose, the controller 6 includes a memory in which a transfer function is recorded, which transfer function makes it possible to compute the speed of the primary pump 3 for producing the appropriate pressure conditions in the process chamber 1. Thus, the processing means installed in the controller 6 perform relationship matching between the first analysis signals that reach them at their first input 100 via the first analysis signal line 10 and the speed control signal at their output 70 connected to the primary pump 3 via the primary pump control line 7, using a pre-recorded transfer function that represents, for each gas mixture present in the process chamber during a step of the treatment, the relationship between the pumping speed, the flow rate of the gas mixture, and the resulting pressure in the process chamber 1.

By means of the gas analysis system integrated into the vacuum generation system, as shown in FIG. 1, it becomes possible to connect the secondary pump 2 to the process chamber 1 via a pipe 21 that is of short length, generally less than 3 meters. In practice, it becomes possible to place the secondary pump 2 in a position adjacent to the process chamber 1, from which it is optionally separated by the pipe 21 provided with an isolation valve 11.

In a variant, the pipe 21 may be no more than the isolation valve 11.

Figure 3:
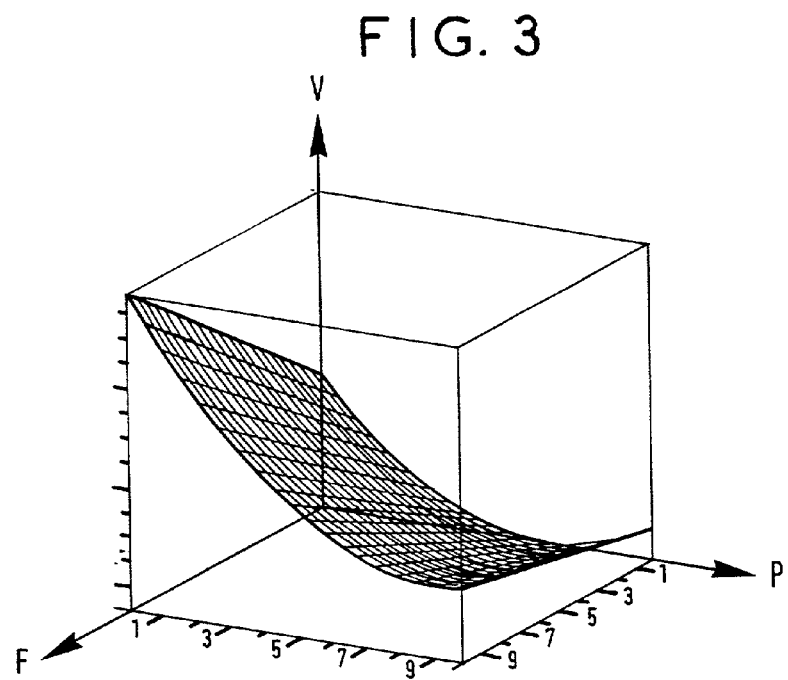
FIG. 3 is a three-dimensional diagram showing a transfer function for a pumped gas, giving the relationship between pumping speed, pumping flow rate, and the pressure obtained in the process chamber.

The transfer function implemented in the controller 6 is, by way of example, shown in FIG. 3, for a specific gas mixture. In this figure, it is possible to see the shape of a surface showing the relationship, in a three-dimensional system, between the gas flow rate present in the chamber and plotted along the F axis, the resulting pressure plotted along the P axis, and the pumping speed plotted up the V axis.

The first function performed by the controller 6 is to adjust the pumping speed in a manner such as to maintain the pressure at a value suitable for each treatment step in the process chamber 1.

In addition, the controller 6 uses the analysis of the extracted gases, as procured by the first gas analyzer means 9 (the result of the analysis being used to adjust the pumping speed, as a function of the pumped gases) to determine the variation of the pressure in the process chamber 1 during the transient stages of the treatment.

In order to adjust the pumping speed as a function of the pumped gases, the transfer function pre-recorded in the controller 6 is thus used. For each gas mixture present in the process chamber 1 during the treatment, the transfer function represents the relationship between the pumping speed V, the flow rate F and the resulting pressure P in the process chamber 1.

In the embodiment shown in FIG. 1, the extracted-gas treatment means 5 connected to the primary pump 3 via a pipe 31 are situated downstream from the primary pump 3. At the outlet of the primary pump 3, before the gas treatment means 5, second gas analyzer means 12 are provided that make it possible to determine the nature and the state of the pumped gases, and that produce second analysis signals which are sent via a line 13 to second signal processing means installed in the controller 6. The second signal processing means, in the controller 6, are suitable for producing second control signals as a function of the analysis signals received from the second gas analyzer means 12, which second control signals can be sent to the speed control apparatus for controlling the speed of the primary pump 3 via the primary pump control line 7.

By means of the information given by the second gas analyzer means 12, the controller 6 is informed of the nature and the state of the pumped gases, and adapts the pumping parameters to optimize the treatment performed by the gas treatment apparatus 5. For this purpose, the primary pump 3 is associated with pump temperature control apparatus 14, and with a dilution gas injector 15 connected to the gas treatment apparatus 5 via a pipe 20. The dilution gas injector 15 makes it possible, if necessary and in controlled manner, to inject dilution gases into the primary pump 3, making it possible to dilute the pumped gases and to prevent them from condensing in the primary pump 3. The dilution gas injector 15 and the pump temperature control apparatus 14 are controlled by the controller 6 which can thus adapt the pumping parameters such as the temperature of the body of the primary pump 3 and the injection of dilution gas, in addition to the speed of the primary pump 3. These possibilities enable the effectiveness of the gas treatment means 5 to be improved significantly so as to reduce the presence of toxic elements at the outlet 4 to as low as possible.

Thus, the apparatus includes pumping conditioning means such as a heat source of the pump temperature control apparatus 14, which heat source heats the body of the primary pump 3, and/or dilution gas injection means 15; second control signals are also generated and sent to said pumping conditioning means 14, 15 so as to optimize the effectiveness of the gas treatment means 5.

In the embodiment shown in FIG. 1, third gas analyzer means 16 are provided, mounted on the pipe 4 and adapted for analyzing the gases output by the gas treatment means 5 and for adapting the gas treatment means 5 themselves as a function of the result of said analysis. In practice, the third gas analyzer means 16 produce signals sent to the controller 6 via the transmission line 22, and the controller 6 controls the gas treatment means 5 via a gas treatment control line 17. Thus, the gases exiting from treatment are analyzed so as to adapt the treatment itself as a function of the result of said analysis. For example, the pumping can be interrupted in the event that a treatment defect is detected by the third gas analyzer means 16.

The gas analyzer means 9, 12, and 16 can, a priori, be of any known type making it possible to analyze rapidly the gases in the short pipes 30, 31, and 4 respectively between the secondary pump 2 and the primary pump 3, between the primary pump 3 and the gas treatment apparatus 5, and at the outlet of the gas treatment apparatus 5.

In an embodiment, such gas analyzer means 9, 12, or 16 may include apparatus for ionizing the gases to be analyzed, which apparatus is constituted by at least one plasma source dedicated to analysis and put in contact with the gases in the pipe, and generating plasma from the gases to be analyzed. The plasma source is fed by a generator suited to the chosen type of plasma source. For example, the plasma source may be a microwave source of the resonant cavity type or of the type using the principle of surface wave propagation, and the generator is a microwave generator. In another embodiment, the plasma source is a radiofrequency plasma source of the inductive coupling plasma (ICP) type, and the generator is a radiofrequency (RF) generator.

The ionized gases may be analyzed by ionized gas analysis apparatus of the optical spectrometer type having a probe situated in the vicinity of the dedicated plasma source, and analyzing the variation of a radiative spectrum emitted by the generated plasma. The radiation emitted by the atoms, molecules, and ions excited by the free electrons of the plasma are transmitted to the optical emission spectrometer which analyzes the variations in the radiations and deduces therefrom information relating to the components of the ionized gases.

The gas analyzer means 9, 12, or 16 may be integrated in series in the pipe 30, 31, or 4 whose gaseous effluent is to be controlled, or else it may be mounted on said pipe via an external fitting.

It can be understood that the controller 6 may be implemented in known manner, based on a microprocessor associated with memories and input-output circuits. A suitable program and data are recorded in the memory of the controller 6 so as to control the members of the vacuum generation and vacuum control apparatus. It is possible to enter in the memory in particular the data of the transfer function as shown in FIG. 3, which data is pre-computed as a function, in particular, of the geometrical shape of the process chamber 1, and of the various vacuum-generating members.

In accordance with the invention, it is advantageously possible to provide a prior training step in which the pumping speed is caused to vary in the presence of at least some of the gas mixtures that can be present during the treatment steps in the process chamber 1, and the flow rate and the resulting pressure in the process chamber 1 are measured to determine the transfer function. By means of this training step, the apparatus of the invention can be self-adaptive to the process chamber 1. For this purpose, a pressure sensor 18 is provided, which pressure sensor is disposed in the process chamber 1, and connected via a pressure line 19 to the controller 6. A training program is recorded in the memory of the controller 6 so as to cause the variations in the speed of the primary pump 3 and/or of the secondary pump 2 in the presence of the appropriate gas mixtures in the process chamber 1.

Figure 2:
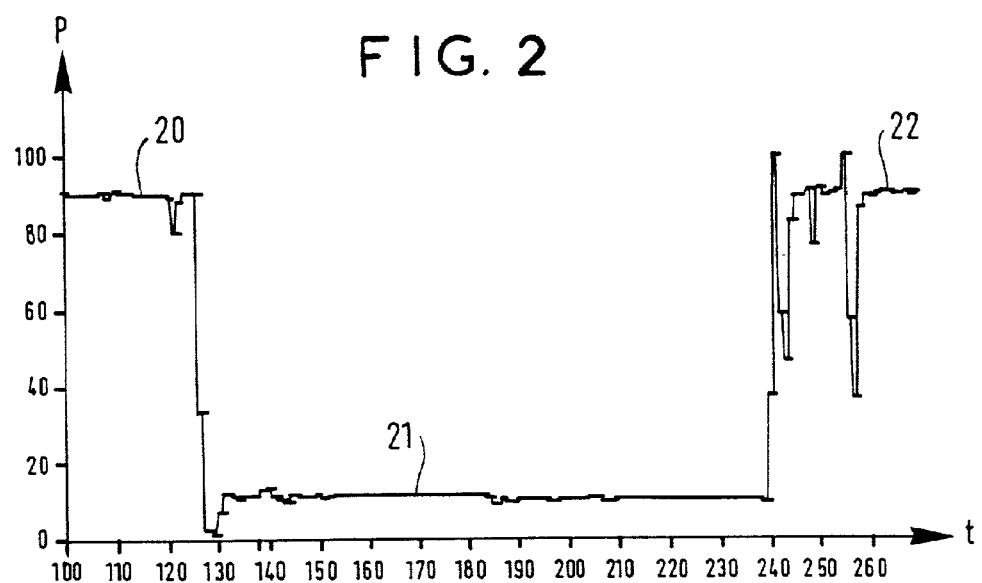
FIG. 2 is a timing diagram showing the pressure variation before, during, and after a treatment step in a process chamber.

FIG. 2 shows the conditions under which the pumping apparatus of the invention can operate when used to control the atmosphere in a process chamber 1. The figure shows a known example of a timing diagram showing how the pressure varies over time and obtained with prior art pumping apparatus. During a first period 20, a substrate is transferred into the process chamber 1. During a second period 21, the pressure is lower, and the substrate is then treated in the process chamber 1. This treatment step may correspond to various treatment gases being present. During a third step 22, the pressure is higher, and the substrate is removed from the process chamber 1. In that known timing diagram, it can be observed that pressure fluctuations can be observed, in particular in the vicinities of the transient stages of the treatment. Those pressure fluctuations induce turbulence and risks of pollution in the process chamber 1. The invention makes it possible to reduce very significantly or even to eradicate the pressure fluctuations and the resulting risks of pollution.

The apparatus of the invention may, as shown in FIG. 1, include the primary pump 3 connected to a single secondary pump 2 for pumping the gases from the process chamber 1.

Alternatively and advantageously, it is possible for the primary pump 3, together with the gas treatment apparatus 5, to be connected to a plurality of secondary pumps 2, each of which is dedicated to a distinct process chamber 1.

By suitably programming the controller 6 which controls the speed of the primary pump 3 and optionally the speed of the secondary pump 2, as well as the pumping parameters such as the temperature of the body of the primary pump 3 and the injection of dilution gas by means of the apparatus 14 and 15, the invention makes it possible to avoid deposits and turbulence in the process chamber 1, and to avoid deposits in the pumping line. The pumping function and the gas treatment function are thus better integrated, which makes it possible to reduce very significantly the costs of the semiconductor manufacturing installations, to increase production capacity, and to improve flexibility significantly by making it easier to dispose the elements of the semiconductor production unit geographically. At the same time, the control of the vacuum function and of the process in the process chamber is improved significantly, and the treatment of the pumped gases is improved.

FIG. 1 shows a particularly advantageous embodiment of the present invention, which embodiment includes isolation means enabling the disturbance caused by the pumping apparatus to the process chamber to be further reduced.

For this purpose, the primary pump 3, the gas treatment means 5, and the gas analyzer means 9, 12, and 16 are enclosed together in an isolation enclosure 23. The isolation enclosure 23 is a sealed enclosure that forms a mechanically-rigid assembly.

Preferably, the isolation enclosure 23 is provided with temperature monitoring and regulation apparatus 24 making it possible to monitor and to regulate the temperature of the contents of the isolation enclosure 23 so as to avoid transmitting thermal disturbance to the elements outside the isolation enclosure 23, in particular to the process chamber 1.

Also preferably, the isolation enclosure 23 is provided with active vibration-compensating means 25 making it possible to compensate actively the mechanical vibrations generated by the contents of the isolation enclosure 23, in particular by the primary pump 3.

The active vibration-compensating means 25 comprise vibration sensors associated mechanically with the isolation enclosure 23, and vibration generators controlled so as to produce vibrations in phase opposition with the vibrations produced by the contents of the isolation enclosure 23.

It is thus possible to reduce the mechanical, thermal, and chemical disturbance generated by the vacuum generation apparatus which can thus be disposed in the immediate vicinity of the process chamber 1.

Preferably, and as shown in FIG. 1, the isolation enclosure 23 further encloses a controller 6 which forms the signal processing means for generating the speed control signal for controlling the speed of the primary pump 3 and/or the speed of the secondary pump as a function of the signals that it receives from the gas analyzer means 9 and 12.

It can be understood that each of the various above-described isolation means could be adapted to a vacuum line independently of the presence or of the absence of the gas analyzer means and of the other means of the invention for controlling the speed of the pumps and the other active members as a function of the gas analysis.

In accordance with the invention, the controller 6 may advantageously be programmed to control the active members of the apparatus (pumps, pumping parameters) in a different manner that is adapted and appropriate as a function of the status of the process chamber equipment 1: production stage; test stage; maintenance stage; standby stage.

The present invention is not limited to the embodiments which are explicitly described, but rather it includes the various variants and generalizations that are accessible to the person skilled in the art.

The invention claimed is:

1. Apparatus for conditioning the atmosphere in a vacuum chamber, said apparatus comprising:
   a vacuum line including said vacuum chamber and comprising a pumping apparatus including at least a primary pump; and
   isolation means comprising an isolation enclosure enclosing said primary pump enabling the disturbance caused by the pumping apparatus to the vacuum chamber to be reduced, wherein the isolation means includes temperature monitoring and regulating apparatus for monitoring and regulating the temperature of the contents of the isolation enclosure.

2. Apparatus according to claim 1, wherein the pumping apparatus is disposed in the immediate vicinity of the vacuum chamber.

3. Apparatus according to claim 2, wherein
the vacuum line comprises a primary pump and at least one upstream secondary pump;
the primary pump is enclosed in an isolation enclosure.

4. Apparatus according to claim 3, wherein
the vacuum line further comprises gas treatment means adapted for treating the extracted gas downstream from the primary pump;
the gas treatment means are enclosed together with the primary pump in said isolation enclosure.

5. Apparatus according to claim 4, wherein
the vacuum line further comprises gas analyzer means adapted for analyzing the gases inside the vacuum line;
the gas analyzer means are enclosed together with the primary pump and the gas treatment means in said isolation enclosure.

6. Apparatus according to claim 3, wherein the isolation means includes active vibration-compensating means for compensating the mechanical vibrations generated by the contents of the isolation enclosure.

7. Apparatus according to claim 5, wherein the isolation enclosure further encloses a controller, constituting signal processing means for generating a speed control signal for controlling the speed of the primary pump and/or the speed of the secondary pump as a function of signals received from gas analyzer means.

8. Apparatus according to claim 6, wherein the active vibration-compensating means comprises vibration sensors associated mechanically with the isolation enclosure and vibration generators controlled so as to produce vibrations in phase opposition with the vibrations produced by the contents of the isolation enclosure as sensed by the vibration sensors.

9. An atmosphere conditioning apparatus, comprising:
a vacuum pump;
a motor for driving the vacuum pump; and
a sealed isolation enclosure surrounding the vacuum pump and the motor;
wherein the enclosure is designed to contain disturbances caused by the vacuum pump and motor combination, further comprising:
a temperature monitoring device; and
a temperature regulating device receiving input from the temperature monitoring device,
wherein the temperature regulating device maintains a predetermined temperature within the sealed isolation enclosure.

10. The atmosphere conditioning apparatus according to claim 9, further comprising:
a vibration sensor; and
a vibration compensating device receiving input from said vibration sensor,
wherein the vibration compensating device creates vibrations to offset the vibrations induced by the vacuum pump and motor.

11. Apparatus for conditioning the atmosphere in a vacuum chamber, said apparatus comprising:
a vacuum line including said vacuum chamber and comprising a pumping apparatus including at least a primary pump; and
isolation means comprising an isolation enclosure enclosing said primary pump enabling the disturbance caused by the pumping apparatus to the vacuum chamber to be reduced,
wherein the vacuum line further comprises gas treatment means adapted for treating the extracted gas downstream from the primary pump and the gas treatment means are enclosed together with the primary pump in said isolation enclosure.

* * * * *